United States Patent
Kuroda et al.

(10) Patent No.: US 10,819,292 B2
(45) Date of Patent: Oct. 27, 2020

(54) LINEAR AMPLIFYING DEVICE, INPUT SIGNAL SUPPLYING METHOD, AND ORIGIN AVOIDING CIRCUIT USED THEREIN

(71) Applicant: NEC Network and Sensor Systems, Ltd., Fuchu-shi, Tokyo (JP)

(72) Inventors: Yasutaka Kuroda, Tokyo (JP); Noriaki Sumita, Tokyo (JP); Takashi Ishikawa, Tokyo (JP); Tomohiko Oohashi, Tokyo (JP); Kazuki Kishi, Tokyo (JP)

(73) Assignee: NEC NETWORK AND SENSOR SYSTEMS, LTD, Tokyo (JP)

( * ) Notice: Subject to any disclaimer, the term of this patent is extended or adjusted under 35 U.S.C. 154(b) by 70 days.

(21) Appl. No.: 16/304,726

(22) PCT Filed: May 29, 2017

(86) PCT No.: PCT/JP2017/019907
§ 371 (c)(1),
(2) Date: Nov. 27, 2018

(87) PCT Pub. No.: WO2017/209045
PCT Pub. Date: Dec. 7, 2017

(65) Prior Publication Data
US 2019/0280653 A1    Sep. 12, 2019

(30) Foreign Application Priority Data

May 30, 2016    (JP) .................................. 2016-107066

(51) Int. Cl.
*H03G 3/20*    (2006.01)
*H03F 1/32*    (2006.01)
(Continued)

(52) U.S. Cl.
CPC ................. *H03F 1/32* (2013.01); *H03F 1/02* (2013.01); *H03F 3/24* (2013.01); *H03F 3/68* (2013.01);
(Continued)

(58) Field of Classification Search
CPC ........................................................ H03G 3/20
(Continued)

(56) References Cited

U.S. PATENT DOCUMENTS 9,002,301 B1    4/2015  Vercesi et al.
2012/0214432 A1  8/2012  Kawasaki
(Continued)

FOREIGN PATENT DOCUMENTS

JP    2002-094358 A    3/2002
JP    2003-023468 A    1/2003
(Continued)

OTHER PUBLICATIONS

International Search Report for PCT Application No. PCT/JP2017/019907, dated Aug. 15, 2017.
(Continued)

*Primary Examiner* — Henry Choe

(57) ABSTRACT

Ringing of a signal after passing through a low pass filter in an LINC type linear amplifier is remedied. A linear amplifying device includes the linear amplifier including the low pass filter for removing high-frequency components; and an origin avoiding circuit which receives an original input signal and is provided upstream of the linear amplifier. If the original input signal is sampled in the vicinity of an origin, the origin avoiding circuit modifies a sampled value so at to replace the sampled value with a fixed value, and supplies the modified input signal to the linear amplifier.

5 Claims, 5 Drawing Sheets

(51) Int. Cl.
| | | |
|---|---|---|
| | *H03F 1/02* | (2006.01) |
| | *H03F 3/24* | (2006.01) |
| | *H03F 3/68* | (2006.01) |
| | *H04L 27/36* | (2006.01) |

(52) U.S. Cl.
CPC ........ *H04L 27/36* (2013.01); *H03F 2200/165* (2013.01)

(58) Field of Classification Search
USPC .................................................. 330/136, 129
See application file for complete search history.

(56) References Cited

U.S. PATENT DOCUMENTS

| | | |
|---|---|---|
| 2013/0335140 A1 | 12/2013 | Kawasaki |
| 2014/0002186 A1 | 12/2014 | Kawasaki |

FOREIGN PATENT DOCUMENTS

| | | |
|---|---|---|
| JP | 2007-150905 A | 6/2007 |
| JP | 2012-175188 A | 9/2012 |
| JP | 2014-011653 A | 1/2014 |
| WO | 2015/172739 A2 | 11/2015 |

OTHER PUBLICATIONS

English translation of Written opinion for PCT Application No. PCT/JP2017/019907.
Extended European Search Report for EP Application No. 17806600.7 dated Dec. 16, 2019.
Japanese Office Action for JP Application No. 2016-107066 dated Jun. 3, 2020 with English Translation.

LINEAR AMPLIFYING DEVICE, INPUT SIGNAL SUPPLYING METHOD, AND ORIGIN AVOIDING CIRCUIT USED THEREIN

This application is a National Stage Entry of PCT/JP2017/019907 filed on May 29, 2017, which claims priority from Japanese Patent Application 2016-107066 filed on May 30, 2016, the contents of all of which are incorporated herein by reference, in their entirety.

TECHNICAL FIELD

This invention relates to a linear amplifying device and, more particularly, to an input signal supplying method for the linear amplifying device and an origin avoiding circuit used therein.

BACKGROUND ART

Low power consumption in power amplifiers leads to a countermeasure against generation of heat and becomes a large problem in various fields such as wireless communications. As one of means for solving the problem, there is an LINC (Linear Amplification using Nonlinear Components) type linear amplifier which linearly amplifies a signal using a plurality of nonlinear amplifiers.

In the LINC type linear amplifier, an input signal is converted into a plurality of constant amplitude signals which are supplied to the plurality of nonlinear amplifiers. With this configuration, it is possible to operate each nonlinear amplifier continuously in a saturated state so that the nonlinear amplifiers can be used at a higher efficiency. Details of the LINC type linear amplifier are described, for example, in Patent Document 1.

The LINC type linear amplifier comprises, upstream of the respective nonlinear amplifiers, low pass filters each of which is for limiting high-frequency components in each constant amplitude signal.

However, in the LINC type linear amplifier, a signal obtained after the converted constant amplitude signal passes through the low pass filter is confirmed in a temporal-axis waveform as shown in FIG. 4. Thus, occurrence of ringing could be confirmed. A mechanism of occurrence of ringing is described, for example, in Patent Document 2.

PRIOR ART DOCUMENTS

Patent Document

Patent Document 1: JP 2014-011653 A
Patent Document 2: JP 2002-094358 A

SUMMARY OF THE INVENTION

Problem to be Solved by the Invention

As described above, due to occurrence of ringing, the input signal supplied to the nonlinear amplifier becomes a signal having an amplitude component without the constant amplitude. Consequently, there arises a problem that the nonlinear amplifier cannot perform an operation continuously in the saturated state that is an advantage of the LINC type amplifier.

It is an object of this invention to provide a linear amplifying device, an input signal supplying method, and an origin avoiding circuit used therein, which solve the above-mentioned problem.

Means to Solve the Problem

A linear amplifying device of the present invention comprises a linear amplifier including a low pass filter which removes high-frequency components; and an origin avoiding circuit which receives an original input signal and which is provided upstream of the linear amplifier, the origin avoiding circuit being configured to, if the original input signal is sampled in the vicinity of an origin, modify a sampled value so as to replace the sampled value with a fixed value to supply a modified input signal to the linear amplifier.

An input signal supplying method of the present invention is a supplying method for supplying an input signal to a linear amplifier including a low pass filter which removes high-frequency components, the input signal supplying method comprising receiving an original input signal; and modifying, if the original input signal is sampled in the vicinity of an origin, a sampled value so as to replace the sampled value with a fixed value to supply a modified input signal to the linear amplifier.

An origin avoiding circuit of the present invention is responsive to an original input signal and supplies a modified input signal to a linear amplifier including a low pass filter which removes high-frequency components, wherein the origin avoiding circuit comprises a comparator configured to compare whether or not the original input signal is sampled in the vicinity of the origin; a non-modification circuit configured to supply, as the modified input signal, the original input signal as it is to the linear amplifier when the comparator determines that the original input signal is not sampled in the vicinity of the origin; and a modification circuit configured to modify the sampled value so as to replace the sampled value with the fixed value in accordance with quadrants on a complex plane to supply the modified input signal to the linear amplifier when the comparator determines that the original input signal is sampled in the vicinity of the origin.

Effect of the Invention

According to this invention, it is possible to remedy ringing of a signal after passing through a low pass filter.

MODE FOR EMBODYING THE INVENTION

Related Art

First, in order to facilitate an understanding of this invention, description will proceed to a related art.

Figure 1:
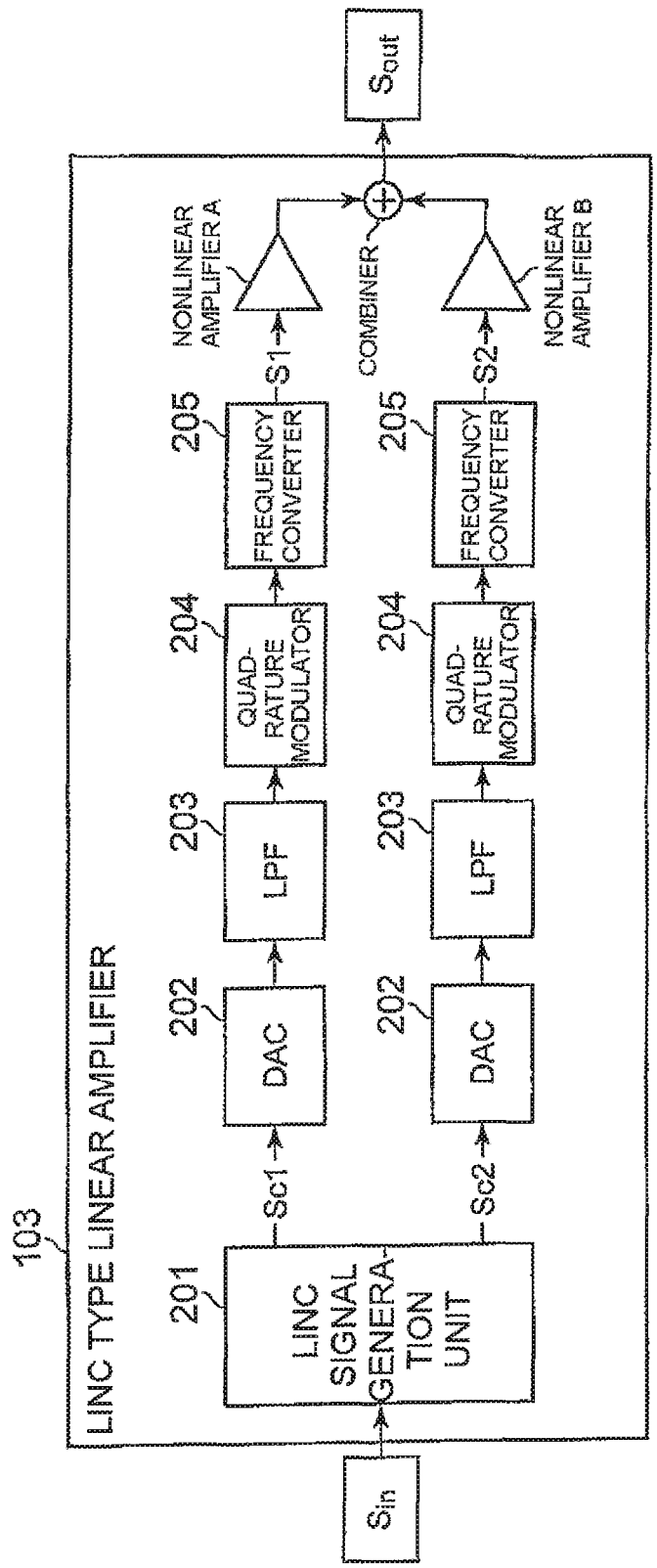
FIG. 1 is a diagram for illustrating an example of configuration of an LINC type linear amplifier used in an example embodiment of this invention.

FIG. 1 is a diagram for illustrating an example of configuration of an LINC type linear amplifier used in an example embodiment of this invention. The illustrated LINC type linear amplifier has a configuration which is substantially similar to that illustrated in FIG. 1 of the above-mentioned Patent Document 1.

The LINC type linear amplifier 103 comprises an LINC signal generation unit 201, two digital-to-analog converters (DACs) 202, two low pass filters (LPFs) 203, two quadrature modulators 204, two frequency converters 205, two nonlinear amplifiers (nonlinear amplifier A, nonlinear amplifier B), and a combiner.

The LINC signal generation unit 201 is supplied with an input modulated signal Sin. The LINC signal generation unit 201 separates the input modulated signal Sin into a pair of phase modulated signals Sc1 and Sc2 having a phase difference according to an amplitude thereof to produce these signals. For example, the input modulation signal Sin comprises a modulation signal with amplitude modulation and phase modulation (angular modulation) while each of the pair of phase modulated signals Sc1 and Sc2 comprises a constant amplitude phase modulated signal with a constant envelope. Herein, each of the input modulation signal Sin and the phase modulated signals Sc1 and Sc2 may be a baseband signal or an intermediate frequency (IF) signal. The LINC signal generation unit 201 produces the pair of phase modulated signals Sc1 and Sc2 as digital signals.

The input modulated signal Sin is also called an input signal while the pair of phase modulated signals Sc1 and Sc2 are also called a pair of constant amplitude signals.

One phase modulated signal Sc1 of the pair of phase modulated signals is converted, by one DAC 202, from a digital signal into an analog signal. Furthermore, the converted analog signal passes through one low pass filter (LPF) 203 to extract a component corresponding to a frequency band of the one phase modulated signal Sc1 of the pair of phase modulated signals and to suppress the other frequency components.

Likewise, the other phase modulated signal Sc2 of the pair of phase modulated signals is converted, by the other DAC 202, from a digital signal into an analog signal. Furthermore, the converted analog signal passes through the other low pass filter (LPF) 203 to extract a component corresponding to a frequency band of the other phase modulated signal Sc2 of the pair of phase modulated signals and to suppress the other frequency components.

In the LINC type linear amplifier 103, one quadrature modulator 204 quadrature-modulates the one phase modulated signal Sc1 that passes through the one low pass filter (LPF) 203. One frequency converter 205 generates, using a high-frequency signal (an oscillation signal) produced by an oscillator (not shown), one high-frequency signal S1 of pair of high-frequency signals comprising RF (Radio Frequency) signals to produce the one high-frequency signal.

Likewise, the other quadrature modulator 204 quadrature-modulates the other phase modulated signal Sc2 that passes through the other low pass filter (LPF) 203. The other frequency converter 205 generates, using the high-frequency signal produced by the oscillator, the other high-frequency signal S2 of the pair of high-frequency signals comprising RF signals to produce the other high-frequency signal.

The pair of amplifiers include two nonlinear amplifiers which are provided in parallel. In FIG. 1, one nonlinear amplifier is depicted at "nonlinear amplifier A" while the other nonlinear amplifier is depicted at "nonlinear amplifier B". The two nonlinear amplifiers have gains and phase characteristics which are substantially equal to each other. Each nonlinear amplifier amplifies the high-frequency signal which is produced by the corresponding frequency converter.

A path from the one DAC 202 to the one nonlinear amplifier (nonlinear amplifier A) is referred to as one branch while the other path from the other DAC 202 to the other nonlinear amplifier (nonlinear amplifier B) is referred to as the other branch.

The combiner combines the pair of high-frequency signals amplified by the pair of amplifiers to produce a combined signal as a high-frequency signal Sout.

Figure 2:
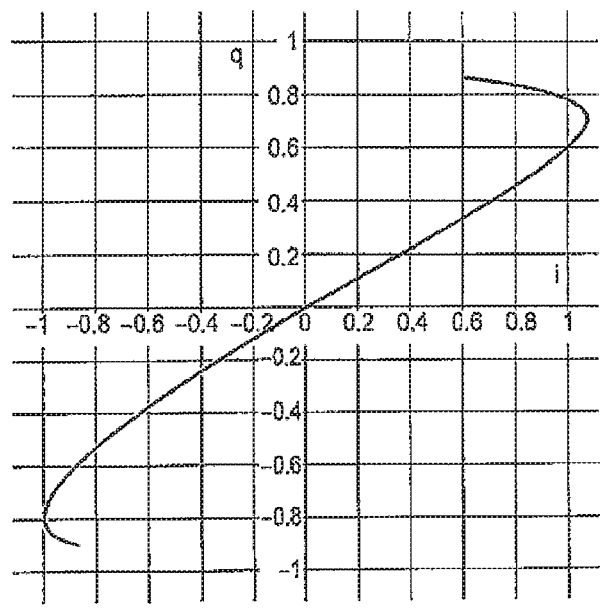
FIG. 2 is a complex plane diagram when an input signal supplied to the LINC type linear amplifier illustrated in FIG. 1 is sampled in the vicinity of the origin.

FIG. 2 is a complex plane diagram (i-q plane diagram) when the input signal Sin is sampled in the vicinity of the origin. It is understood that a phase of the input signal Sin largely changes in the vicinity of the origin as shown in FIG. 2.

Figure 3:
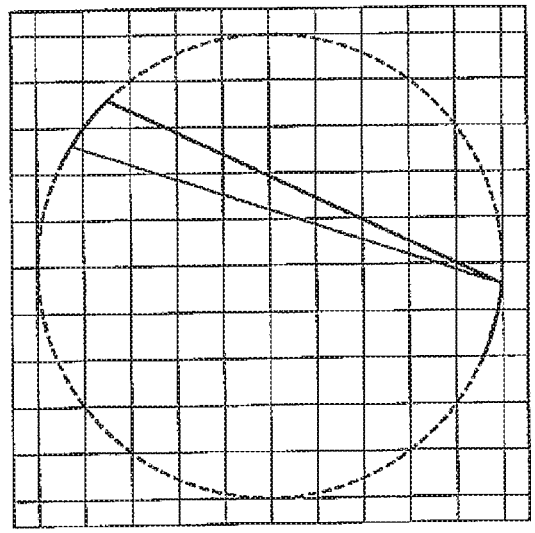
FIG. 3 is a waveform diagram on a complex plane of a pair of constant amplitude signals which are produced by an LINC signal generation unit in FIG. 1.

As a result, the pair of constant amplitude signals Sc1 and Sc2 produced by the LINC signal generation unit 201 have a waveform on the complex plane as shown in FIG. 3.

Figure 4:
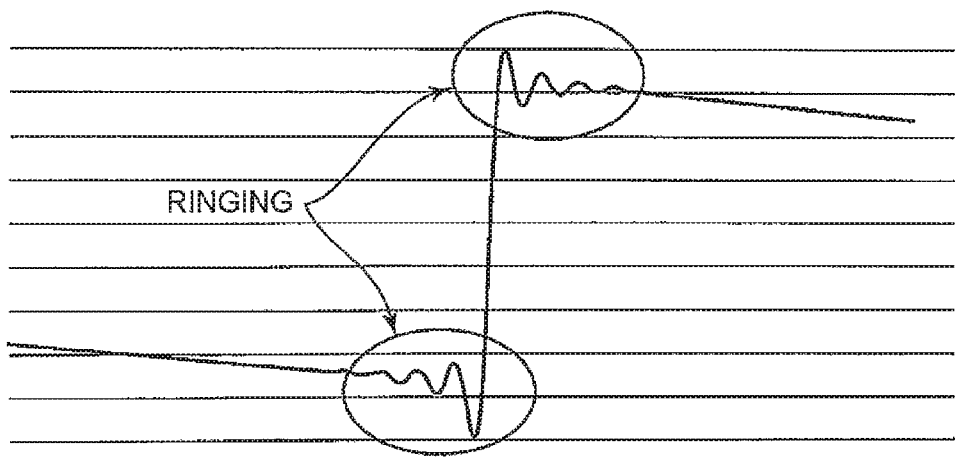
FIG. 4 is a view in which signals obtained after the pair of constant amplitude signals produced by the LINC signal generation unit in FIG. 1 pass through LPFs are confirmed in a temporal-axis waveform.

FIG. 4 is a view in which signals obtained after the pair of constant amplitude signals Sc1 and Sc2 pass through the LPFs 203 are confirmed in a temporal-axis waveform. As shown in FIG. 4, it is confirmed that ringing occurs in the signals after passing through the LPFs 203.

Figure 5:
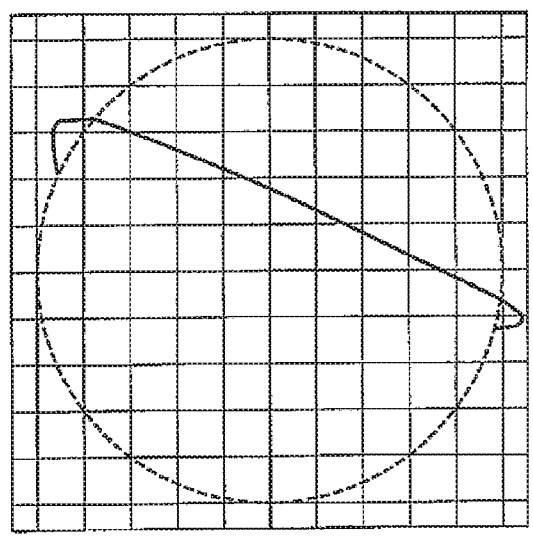
FIG. 5 is a complex plane diagram showing a waveform of the signals illustrated in FIG. 4.

FIG. 5 is a complex plane diagram showing a waveform of the signals at that time.

Example Embodiments

Next, with reference to the drawings, description will proceed to example embodiments of this invention in detail. Configurations described in the respective example embodiments below are merely exemplifications and the technical scope of this invention is therefore not limited thereto.

Figure 6:
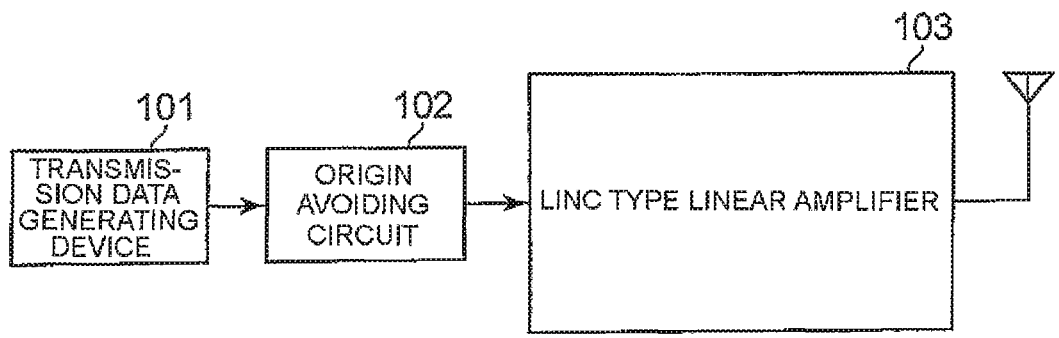
FIG. 6 is a block diagram for illustrating a linear amplifying device according to one example embodiment of this invention.

FIG. 6 is a block diagram for illustrating a linear amplifying device according to an example embodiment of this invention.

As shown in FIG. 6, the illustrated linear amplifying device is configured so that an origin avoiding circuit 102 is disposed upstream of the LINC type linear amplifier 103.

By using the origin avoiding circuit 102, it is possible to remedy the ringing by supplying, as the input signal Sin to the LINC signal generation unit 201 (FIG. 1), an arbitrary value upon sampling the vicinity of the origin so as not to sample the vicinity of the origin.

Now, description will proceed to an operation of the linear amplifying device illustrated in FIG. 6.

The origin avoiding circuit 102 receives an original input signal generated by a transmission data generating device 101, supplies (substitutes) the arbitrary value upon sampling the vicinity of the origin so that the input signal is not sampled in the vicinity of the origin, and produces a modified input signal Sin.

The origin avoiding circuit 102 supplies the modified input signal Sin to the LINC signal generation unit 201 (FIG. 1) of the LINC type linear amplifier 103 so as to remedy the ringing occurring when the constant amplitude signals generated therein pass through the LPFs 203. As a result, the maximum value exceeding the constant amplitude due to the ringing can be reduced to 10% or less.

Figure 7:
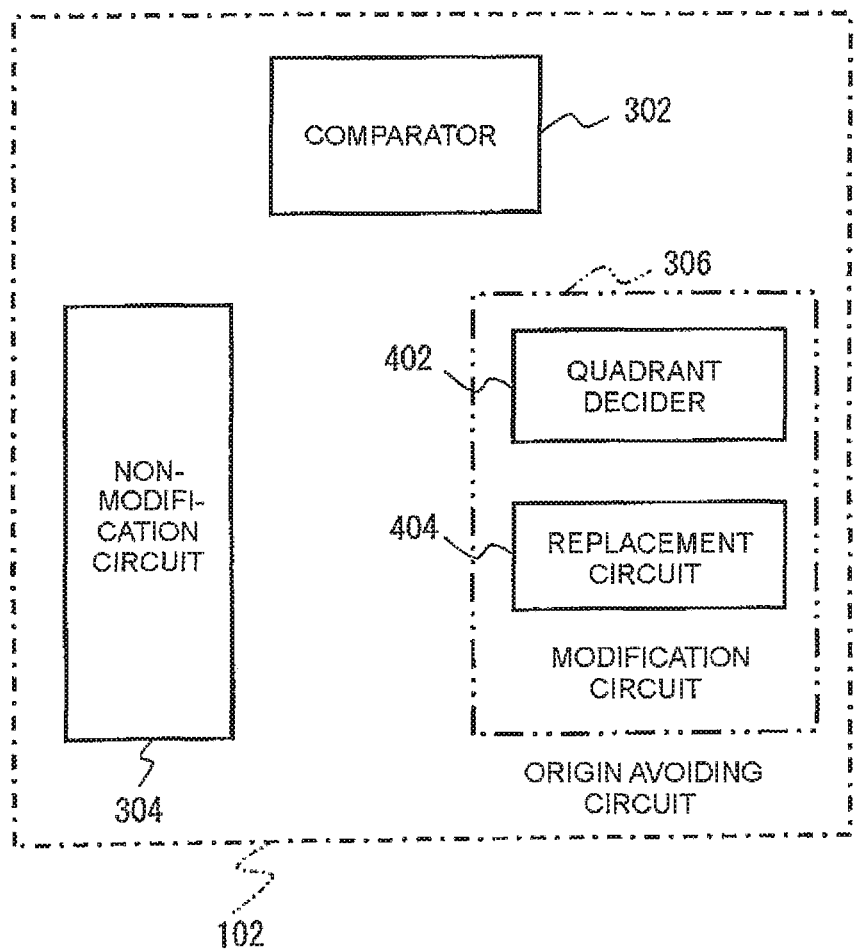
FIG. 7 is a block diagram for illustrating a configuration of an origin avoiding circuit for use in the linear amplifying device in FIG. 6.

FIG. 7 is a block diagram for illustrating a configuration of the origin avoiding circuit 102. The origin avoiding circuit 102 comprises a comparator 302, a non-modification circuit 304, and a modification circuit 306. The modification circuit 306 comprises a quadrant decider 402 and a replacement circuit 404.

The comparator 302 compares whether or not the original input signal is sampled in the vicinity of the origin. When the comparator 302 determines that the original input signal is not sampled in the vicinity of the origin, the non-modification circuit 304 supplies, as the modified input signal, the original input signal as it is to the linear amplifier 103. When the comparator 302 determines that the original input signal is sampled in the vicinity of the origin, the modification circuit 306 modifies a sampled value so as to replace the sampled value with a fixed value in accordance with quadrants on the complex plane and supplies the modified input signal to the linear amplifier 103.

The quadrant decider 402 decides which quadrant on the complex plane the original input signal is sampled in. The replacement circuit 404 replaces, in response to a decided result of the quadrant decider 402, the sampled value with the fixed value in accordance with respective quadrants.

Figure 8:
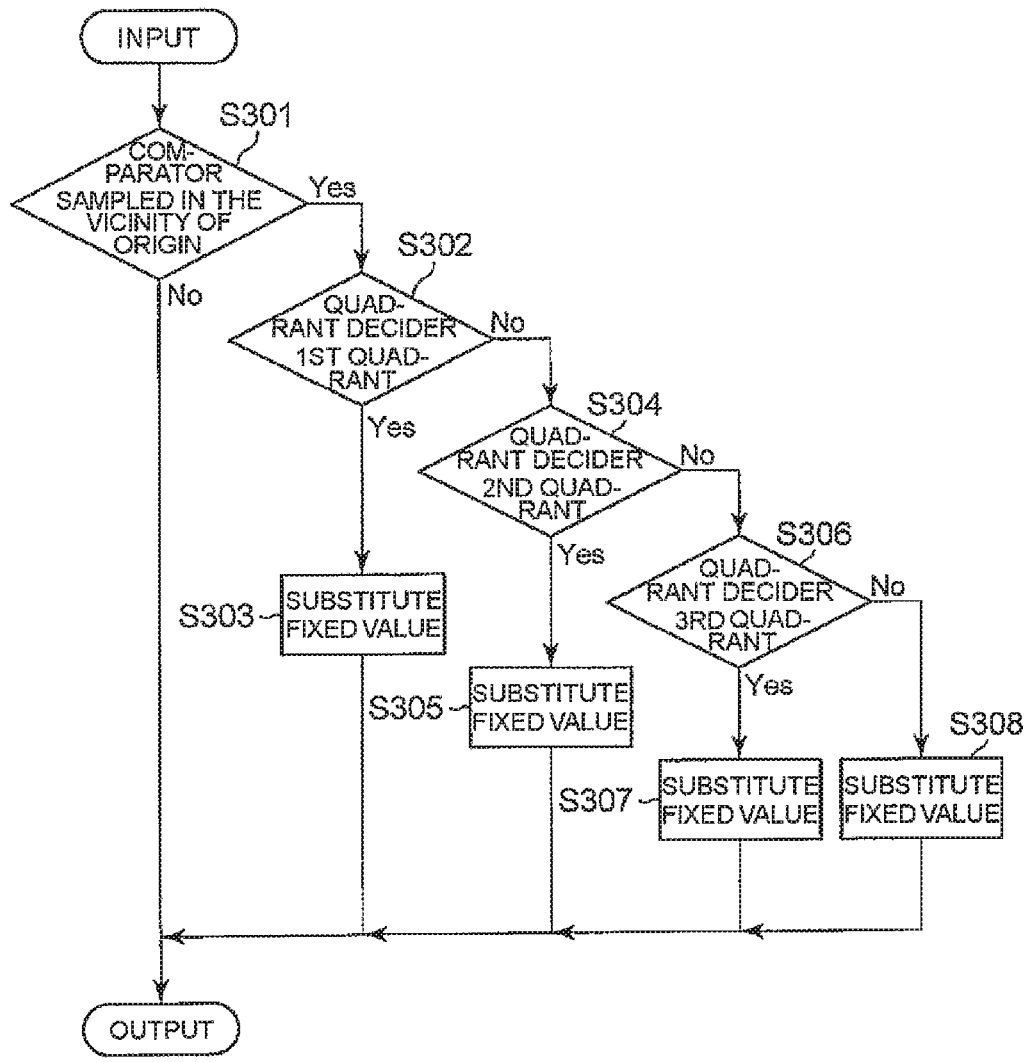
FIG. 8 is a flow chart for describing an operation of the origin avoiding circuit for use in the linear amplifying device in FIG. 6.

FIG. 8 is a flow chart for use in describing an operation of the origin avoiding circuit 102.

The origin avoiding circuit 102 includes the comparator 302 and the quadrant decider 402 as shown in FIG. 7.

Now, description will proceed to an operation of the origin avoiding circuit 102.

First, the origin avoiding circuit 102 compares, using the comparator 302, whether or not the original input signal is sampled in the vicinity of the origin (step S301).

When the original input signal is not sampled in the vicinity of the origin (No in the step S301), the non-modification circuit 304 of the origin avoiding circuit 102 produces, as the modified input signal Sin, the original input signal as it is.

On the other hand, when the original input signal is sampled in the vicinity of the origin (Yes in the step S301), the modification circuit 306 of the origin avoiding circuit 102 decides, using the quadrant decider 402, which quadrant on the complex plane the original input signal is sampled in, and replaces the sampled value with the fixed value in accordance with respective quadrants to produce the fixed value.

Specifically, the quadrant decider 402 first decides whether or not the original input signal is sampled in the first quadrant on the complex plane (step S302). When the quadrant decider decides that the original input signal is sampled in the first quadrant (Yes in the step S302), the replacement circuit 404 in the modification circuit 306 of the origin avoiding circuit 102 replaces the sampled value with the fixed value in accordance with the first quadrant (substitutes the fixed value) to produce the substituted fixed value as the modified input signal (step S303).

When the quadrant decider decides that the original input signal is not sampled in the first quadrant (No in the step S302), the quadrant decider 402 decides whether or not the original input signal is sampled in the second quadrant on the complex plane (step S304). When the quadrant decider decides that the original input signal is sampled in the second quadrant (Yes in the step S304), the replacement circuit 404 in the modification circuit 306 of the origin avoiding circuit 102 replaces the sampled value with the fixed value in accordance with the second quadrant (substitutes the fixed value) to produce the substituted fixed value as the modified input signal (step S305).

When the quadrant decider decides that the original input signal is not sampled in the second quadrant (No in the step S304), the quadrant decider 402 decides whether or not the original input signal is sampled in the third quadrant on the complex plane (step S306). When the quadrant decider decides that the original input signal is sampled in the third quadrant (Yes in the step S306), the replacement circuit 404 in the modification circuit 306 of the origin avoiding circuit 102 replaces the sampled value with the fixed value in accordance with the third quadrant (substitutes the fixed value) to produce the substituted fixed value as the modified input signal (step S307).

Then, when the quadrant decider decides that the original input signal is not sampled in the third quadrant (No in the step S306), the replacement circuit 404 in the modification circuit 306 of the origin avoiding circuit 102 replaces the sampled value with the fixed value in accordance with the fourth quadrant (substitutes the fixed value) to produce the substituted fixed value as the modified input signal (step S308).

Now, description will proceed to effects of the example embodiment.

The example embodiment of this invention described above exhibits the effects as described below.

By avoiding the sampling in the vicinity of the origin in a modulated wave by using the origin avoiding circuit 102, it is possible to remedy the ringing of the signals after passing through the low pass filters 203 so that the nonlinear amplifiers can be used at a higher efficiency.

This invention is not limited to the above-mentioned example embodiment as it is, but can be embodied by modifying components in the practical phase without departing from the gist thereof. In addition, it is possible to form various inventions by appropriately combining a plurality of components.

While this invention has been described above with reference to example embodiments thereof, the invention is not limited to these embodiments. It will be understood by those of ordinary skill in the art that various changes in configuration and details of this invention may be made within the scope of this invention.

This application is based upon and claims the benefit of priority from Japanese Patent Application No. 2016-107066, filed on May 30, 2016, the disclosure of which is incorporated herein in its entirety by reference.

REFERENCE SIGNS LIST 101 transmission data generating device
102 origin avoiding circuit
103 LINC type linear amplifier
302 comparator
304 non-modification circuit
306 modification circuit
402 quadrant decider
404 replacement circuit

What is claimed is:

1. A linear amplifying device, comprising:
a linear amplifier including a low pass filter which removes high-frequency components; and
an origin avoiding circuit which receives an original input signal and which is provided upstream of the linear amplifier, the origin avoiding circuit being configured to, if the original input signal is sampled in the vicinity of an origin, modify a sampled value so as to replace the sampled value with a fixed value to supply a modified input signal to the linear amplifier,
wherein the origin avoiding circuit comprises:
a comparator configured to compare whether or not the original input signal is sampled in the vicinity of the origin;
a non-modification circuit configured to supply, as the modified input signal, the original input signal as it is to the linear amplifier when the comparator determines that the original input signal is not sampled in the vicinity of the origin; and
a modification circuit configured to modify the sampled value so as to replace the sampled value with the fixed value in accordance with quadrants on a complex plane to supply the modified input signal to the linear amplifier when the comparator determines that the original input signal is sampled in the vicinity of the origin,
wherein the modification circuit comprises:
a quadrant decider configured to decide which quadrant on the complex plane the original input signal is sampled in; and
a replacement circuit configured to replace, in response to a decided result of the quadrant decider, the sampled value with the fixed value in accordance with respective quadrants.

2. The linear amplifying device according to claim 1, wherein the linear amplifier comprises an LINC (Linear Amplification using Nonlinear Components) type linear amplifier.

3. A supplying method for supplying an input signal to a linear amplifier including a low pass filter which removes high-frequency components, the supplying method comprising:
receiving an original input signal; and
modifying, if the original input signal is sampled in the vicinity of an origin, a sampled value so as to replace the sampled value with a fixed value to supply a modified input signal to the linear amplifier,
wherein the supplying method comprises:
comparing, by a comparator, whether or not the original input signal is sampled in the vicinity of the origin;
supplying, as the modified input signal, the original input signal as it is to the linear amplifier when the comparator determines that the original input signal is not sampled in the vicinity of the origin; and
modifying the sampled value so as to replace the sampled value with the fixed value in accordance with quadrants on a complex plane to supply the modified input signal to the linear amplifier when the comparator determines that the original input signal is sampled in the vicinity of the origin,
wherein the modifying comprises:
deciding, by a quadrant decider, which quadrant on the complex plane the original input signal is sampled in; and
replacing, in response to a decided result of the quadrant decider, the sampled value with the fixed value in accordance with respective quadrants.

4. The supplying method according to claim 3, wherein the linear amplifier comprises an LINC (Linear Amplification using Nonlinear Components) type linear amplifier.

5. An origin avoiding circuit responsive to an original input signal to supply a modified input signal to a linear amplifier including a low pass filter which removes high-frequency components, wherein the origin avoiding circuit comprises:
a comparator configured to compare whether or not the original input signal is sampled in the vicinity of an origin;
a non-modification circuit configured to supply, as the modified input signal, the original input signal as it is to the linear amplifier when the comparator determines that the original input signal is not sampled in the vicinity of the origin; and
a modification circuit configured to modify the sampled value so as to replace the sampled value with the fixed value in accordance with quadrants on a complex plane to supply the modified input signal to the linear amplifier when the comparator determines that the original input signal is sampled in the vicinity of the origin,
wherein the modification circuit comprises:
a quadrant decider configured to decide which quadrant on the complex plane the original input signal is sampled in; and
a replacement circuit configured to replace, in response to a decided result of the quadrant decider, the sampled value with the fixed value in accordance with respective quadrants.

* * * * *